(12) United States Patent
Yao et al.

(10) Patent No.: US 11,791,278 B2
(45) Date of Patent: Oct. 17, 2023

(54) DISPLAY SUBSTRATE MOTHERBOARD AND MANUFACTURING METHOD THEREOF, DISPLAY SUBSTRATE AND DISPLAY APPARATUS

(71) Applicants: Ordos Yuansheng Optoelectronics Co., Ltd., Inner Mongolia (CN); BOE Technology Group Co., Ltd., Beijing (CN)

(72) Inventors: Lei Yao, Beijing (CN); Feng Li, Beijing (CN); Lei Yan, Beijing (CN); Kai Li, Beijing (CN); Chenglong Wang, Beijing (CN); Teng Ye, Beijing (CN); Lin Hou, Beijing (CN); Xiaofang Li, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/483,822

(22) Filed: Sep. 24, 2021

(65) Prior Publication Data
US 2022/0173050 A1  Jun. 2, 2022

(30) Foreign Application Priority Data
Nov. 27, 2020  (CN) .......................... 202011363569.6

(51) Int. Cl.
*H01L 23/544* (2006.01)
*H01L 27/12* (2006.01)

(52) U.S. Cl.
CPC ........ *H01L 23/544* (2013.01); *H01L 27/1248* (2013.01); *H01L 27/1259* (2013.01); *H01L 2223/54426* (2013.01)

(58) Field of Classification Search
None
See application file for complete search history.

(56) References Cited

U.S. PATENT DOCUMENTS 6,621,542 B1 *  9/2003  Aruga .................. G02F 1/1333
349/122
2007/0199921 A1  8/2007  Roh
(Continued)

FOREIGN PATENT DOCUMENTS

CN          1295314 A      5/2001
CN        101063765 A     10/2007
(Continued)

*Primary Examiner* — Bo B Jang
(74) *Attorney, Agent, or Firm* — Ling Wu; Stephen Yang; Ling and Yang Intellectual Property (57) ABSTRACT

Provided are a display substrate motherboard and manufacturing method thereof, a display substrate and a display apparatus. The display substrate motherboard includes a substrate, a display substrate area on the substrate, and a mark area on the periphery of the display substrate area. The display substrate motherboard also includes a thin film transistor disposed in the display substrate area, a mark structure disposed in the mark area and a planarization layer disposed on one side of the thin film transistor away from the substrate, and the planarization layer includes a groove which is disposed at the corresponding position of the mark structure and extends along a direction close to the substrate, and an orthographic projection of the groove on the substrate covers an orthographic projection of the mark structure on the substrate.

18 Claims, 9 Drawing Sheets

(56) References Cited

U.S. PATENT DOCUMENTS

| | | |
|---|---|---|
| 2014/0146166 A1 | 5/2014 | Shin |
| 2017/0263564 A1 | 9/2017 | Kim et al. |
| 2020/0176390 A1 | 6/2020 | Chen et al. |

FOREIGN PATENT DOCUMENTS

| | | |
|---|---|---|
| CN | 103715179 A | 4/2014 |
| CN | 109742054 A | 5/2019 |
| CN | 110911584 A | 3/2020 |
| CN | 111261581 A | 6/2020 |

* cited by examiner

DISPLAY SUBSTRATE MOTHERBOARD AND MANUFACTURING METHOD THEREOF, DISPLAY SUBSTRATE AND DISPLAY APPARATUS

CROSS-REFERENCE TO RELATED APPLICATION

The present application claims the priority of Chinese Patent Application No. 202011363569.6 filed to the CNIPA on Nov. 27, 2020, the content of which is hereby incorporated by reference.

TECHNICAL FIELD

Embodiments of the present disclosure relate to, but are not limited to, the field of display technology, in particular to a display substrate motherboard and a manufacturing method thereof, a display substrate and a display apparatus.

BACKGROUND

Total reflective display apparatuses and transflective display apparatuses are attracting growing attention, and are widely used in outdoor displays such as electronic price tags, billboards and watches.

In order to meet the high reflectivity requirements of such products, metals with extremely high reflectivity, for example, Ag (silver) metal, are added as reflective layers. However, in the substrate manufacturing process of this kind of products, the designed mark cannot be identified during the Mask process because of the high reflectivity of the reflective layer.

SUMMARY

The following is a summary of subject matter described in detail in the present disclosure. This brief description is not intended to limit the scope of protection of the claims.

Embodiments of the present disclosure provide a display substrate motherboard, a manufacturing method thereof, a display substrate and a display apparatus, which can effectively solve the problem that marks cannot be identified due to extremely high reflectivity of a reflective layer.

Embodiments of the present disclosure mainly provide following technical solutions.

In a first aspect, an embodiment of the present disclosure provides a display substrate motherboard. The display substrate motherboard includes a substrate, a display substrate area on the substrate, and a mark area on the periphery of the display substrate area. The display substrate motherboard also includes a thin film transistor disposed in the display substrate area, a mark structure disposed in the mark area and a planarization layer disposed on one side of the thin film transistor away from the substrate, and the planarization layer includes a groove which is disposed at the corresponding position of the mark structure and extends along a direction close to the substrate, and an orthographic projection of the groove on the substrate covers an orthographic projection of the mark structure on the substrate.

In a second aspect, an embodiment of the disclosure further provides a display substrate formed by a display substrate area obtained by cutting a display substrate motherboard along a mark area.

In a third aspect, an embodiment of the present disclosure provides a display apparatus which includes any one of the above display substrates.

In a fourth aspect, an embodiment of the disclosure provides a manufacturing method of a display substrate motherboard, wherein the display substrate motherboard includes a substrate, a display substrate area on the substrate, and a mark area on the periphery of the display substrate area; the manufacturing method includes: forming a thin film transistor in the display substrate area, and forming a mark structure in the mark area; forming a planarization layer covering the thin film transistor and the mark area; forming a groove which is disposed at the corresponding position of the mark structure and extends along a direction close to the substrate in the planarization layer.

Other features and advantages of the present disclosure will be described in the subsequent description, and, in part, become apparent from the description, or can be understood by implementing the present disclosure. Other advantages of the present disclosure may be achieved and obtained by the solutions described in the specification and drawings.

After reading and understanding the drawings and the detailed description, other aspects can be understood.

BRIEF DESCRIPTION OF DRAWINGS

The drawings provide an understanding of the technical solutions of the present disclosure, form a part of the specification, and are used to explain, together with the embodiments of the present disclosure, the technical solutions of the present disclosure and not intended to form limits to the technical solutions of the present disclosure. The shape and size of each component in the drawings do not reflect true proportions and only to be used to schematically illustrate contents of the present disclosure.

DETAILED DESCRIPTION

Multiple embodiments are described in the present disclosure, but the description is exemplary rather than limiting, and there may be more embodiments and implementation solutions within the scope of the embodiments described in the present disclosure. Although many possible feature combinations are shown in the drawings and discussed in specific implementation modes, the disclosed features may also be combined in many other manners. Unless specifically limited, any feature or element of any embodiment may be used in combination with or in place of any other feature or element in any other embodiment.

When describing representative embodiments, the specification may have presented methods and/or processes as a specific order of steps. However, to the extent that the method or process does not depend on the specific order of steps described in the present disclosure, the method or process should not be limited to the specific order of steps described. As understood by those of ordinary skill in the art, other step sequences are also possible. Therefore, the specific order of acts set forth in the specification should not be interpreted as limiting the claims. In addition, the claims for the method and/or process should not be limited to the steps performed in the written order, and those of skilled in the art may readily understand that these orders may vary and still remain within the spirit and scope of the embodiments of the present disclosure.

In the drawings, the size of each constituent element, or the thickness or area of a layer, is sometimes exaggerated for clarity. Therefore, an implementation of the present disclosure is not necessarily limited to the size shown, and a shape and size of each component in the drawings do not reflect true proportions. In addition, the drawings schematically illustrate ideal examples, and any embodiment of the present disclosure is not limited to the shapes, numerical values or the like illustrated in the drawings.

The "first", "second", "third" and other ordinal numbers in the present disclosure are used to avoid confusion of constituent elements, not to provide any quantitative limitation.

In the present disclosure, for the sake of convenience, wordings such as "central", "upper", "lower", "front", "rear", "vertical", "horizontal", "top", "bottom", "inner", "outer" and the others describing the orientations or positional relations are used to depict positional relations of elements with reference to the drawings, which are only convenient for describing the disclosure and simplifying description, rather than for indicating or implying that the apparatus or element referred to must have a specific orientation, or must be constructed and operated in a particular orientation, and therefore, those wordings cannot be construed as limitations on the present disclosure. The positional relations of each of the constituent elements may be appropriately changed according to the direction in which constituent elements are described. Therefore, the wordings described herein are not restrictive, and may be appropriately replaced according to the situation.

In the present disclosure, a transistor refers to an element including at least three terminals, namely, a gate electrode, a drain electrode and a source electrode. The transistor has a channel area between the drain electrode drain electrode terminal, drain area or drain electrode) and the source electrode (source electrode terminal, source area or source electrode), and the current may flow through the drain electrode, the channel area and the source electrode. In the present disclosure, the channel area refers to an area through which the current mainly flows. Functions of "source electrode" and "drain electrode" may sometimes be exchanged when transistors of opposite polarities are used or when the current direction changes during circuit operation. Therefore, in the present disclosure, "the source electrode" and "the drain electrode" are interchangeable.

In the present disclosure, "parallel" refers to a state in which an angle formed by two straight lines is greater than or equal to −10° and less than or equal to 10°, and thus further includes a state in which the angle is greater than or equal to −5° and less than or equal to 5°. In addition, "vertical" refers to a state where two straight lines form an angle above 80° and below 100°, and thus includes a state where the angle is above 85° and below 95°.

Figure 1A:
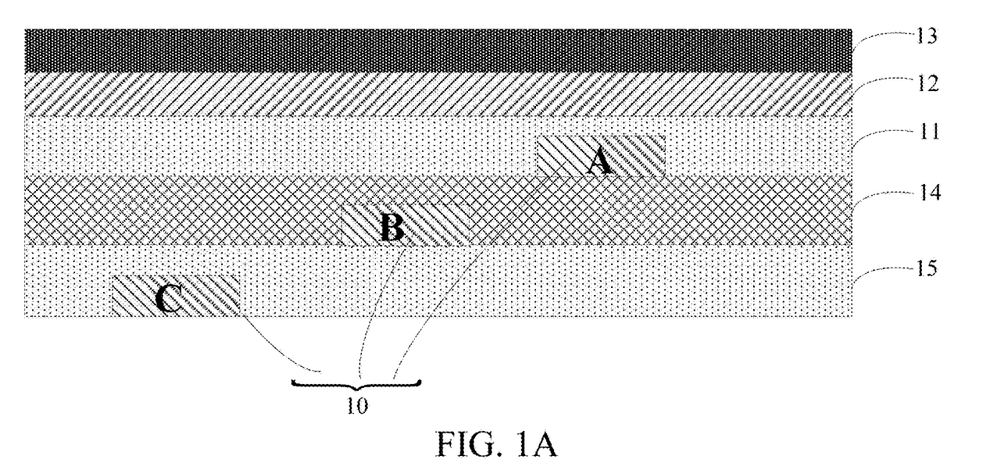
FIG. 1A is a schematic diagram of a mark area in a display substrate motherboard in some technologies.
Figure 1B:
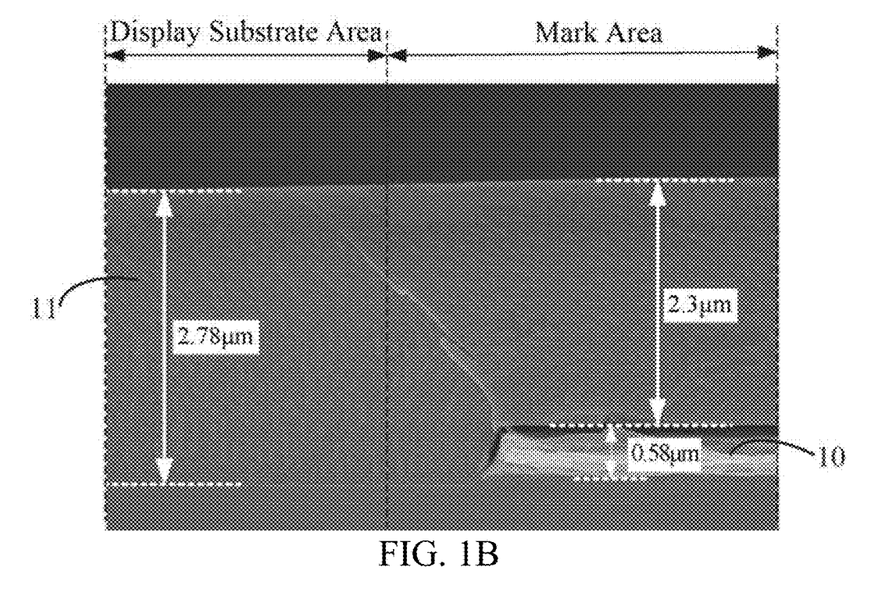
FIG. 1B is an SEM (Scanning Electron Microscope) diagram of a mark area in the display substrate motherboard shown in FIG. 1A.
Figure 1C:
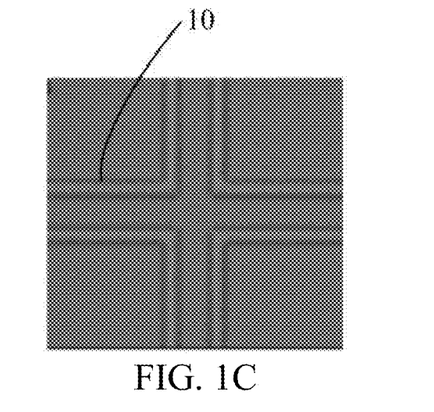
FIG. 1C is a schematic diagram of a recognition result of a mark structure in the display substrate motherboard shown in FIG. 1A.
Figure 1D:
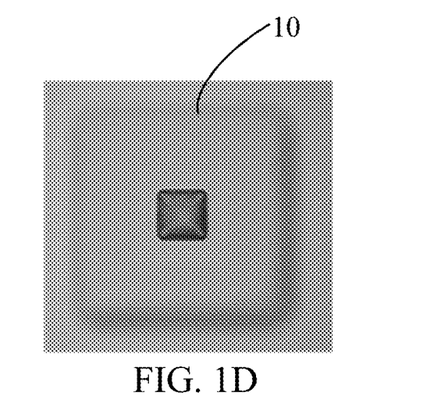
FIG. 1D is a schematic diagram of another recognition result of the mark structure in the display substrate motherboard shown in FIG. 1A.
Figure 1E:
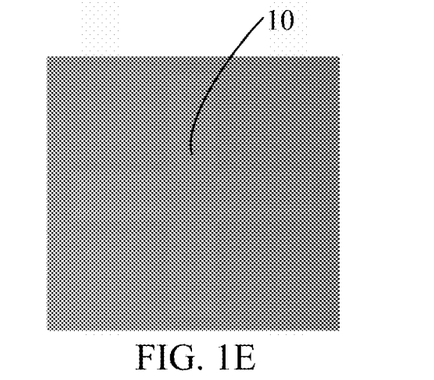
FIG. 1E is a schematic diagram of another recognition result of the mark structure in the display substrate motherboard shown in FIG. 1A.

In the identification, testing and monitoring of a mark during a manufacturing process of a substrate, the device used for identifying the mark e.g., an exposure machine) often adopts a multi-directional light supply mode of front, side and back, which identifies and grasps the difference of reflected light between a mark position and a non-mark position through the lens of the device. However, for a total reflection display apparatus and a transflective display apparatus, for example, as shown in FIG. 1A, during the Mask process of the reflective layer, the film layers located directly above and covering the mark structure 10 at least includes a planarization layer (PLN) 11, a reflective layer (e.g., Ag layer) 12, and a photoresist (PR) layer 13. (For example, taking the example where the mark structure 10 includes a mark A disposed in the same layer as a source/drain metal layer in a thin film transistor, a mark B disposed in the same layer as a gate electrode in the thin film transistor and a mark C disposed in the same layer as an active layer in the thin film transistor, a planarization layer 11, a reflection layer 12 and a photoresist layer 13 may be included above the mark A; an inter layer dielectric layer (ILD) 14, a planarization layer 11, a reflective layer 12 and a photoresist layer 13 may be included above the mark B; and a gate insulator layer (GI), an ILD layer 15, a planarization layer 11, a reflection layer 12 and a photoresist layer 13 may be included above the mark C). Since PLN planarizes mark, and the reflective layer (e.g., Ag) is disposed on PLN film, there is basically no step difference between the area of the reflective layer at the corresponding position of the mark structure and the adjacent area (e.g., as shown in FIG. 1B, a thickness h1 of mark (i.e., the mark structure 10) may be about 0.58 µm (micron), a thickness h2 of the planarization layer 11 located in the non-mark area may be about 2.78 µm, while a thickness h3 of the planarization layer 11 located in the mark area covering the mark area may be about 2.3 µm, so a height difference h4 between the mark area and the adjacent non-mark area may be about 0.01 µm), and the reflectivity of the reflective layer is extremely high, which leads to a small and insufficient gray scale difference (i.e., small contrast) between the edge of the mark and the adjacent non-mark area (i.e., the display substrate area for forming the display substrate). Therefore, as shown in FIG. 1C to FIG. 1E, the light reflection or light transmittance between the mark area and the adjacent non-mark area is basically the same, which makes the edge of the mark structure 10 unclear, causing the mark cannot be effectively identified. In the present disclosure, thickness refers to a feature in a direction away from the substrate.

An embodiment of the present disclosure provides a display substrate motherboard. The display substrate motherboard may include a substrate, a display substrate area on the substrate, and a mark area on the periphery of the display substrate area. The display substrate motherboard may further include a thin film transistor disposed in the display substrate area, a mark structure disposed in the mark area and a planarization layer disposed on one side of the thin film transistor away from the substrate, and the planarization layer includes a groove which is disposed at the corresponding position of the mark structure and extends along a direction close to the substrate, and an orthographic projection of the groove on the substrate covers an orthographic projection of the mark structure on the substrate. In this way, by providing the groove at the corresponding position of the mark structure in the planarization layer, the area where the groove is located (i.e., the area at the corresponding position of the mark structure in the planarization layer) is lower than the area adjacent to the groove (that is, the area adjacent to the corresponding position of the mark structure in the planarization layer) in the planarization layer, generating a large step difference between the two areas. The light between the mark structure and the lens of the device for identifying the mark can be less refracted and less absorbed, and the reflectivity difference between the corresponding area of the mark structure and the surrounding area may be increased (i.e., the light reflection or light transmittance difference between the corresponding area of the mark structure and the surrounding area is larger), thereby improving the clarity of the mark structure, increasing the identification success rate of the mark structure, while greatly reducing the defective rate caused by the inability to identify the mark during the manufacturing process of a substrate.

In an exemplary embodiment, the types of mark structures are not particularly limited, for example, according to different functions, the mark structure may include, but is not limited to, a first plate alignment mark for alignment calibration during exposure alignment, a glass center mark for determining a center position of a substrate (such as a glass substrate) during testing, a second plate alignment mark for testing the actual alignment accuracy during Mask process control, and a cutting mark for cutting a display substrate (single panel) from a display substrate motherboard.

In an exemplary embodiment, the display substrate motherboard may further include: a reflective layer disposed on a side of a planarization layer away from a substrate; in a direction away from the substrate, a first area covering a groove in a reflective layer is lower than a second area adjacent to the first area in the reflective layer, and a step difference between the first area and the second area is larger than a preset threshold. Here, because part of the film layer in the mark area in the planarization layer is removed (i.e., grooves are provided in the planarization layer), the first area covering the grooves in the reflective layer is lower than the second area adjacent to the first area in the reflective layer after the entire layer of the reflective layer is formed. And since there is a step difference between the first area and the second area that is larger than the preset threshold, the light between the mark structure and the lens of the device for identifying marks is less refracted and less absorbed less. In addition, the reflectivity difference between the groove and the mark structure in the mark area and the peripheral display substrate area is rather large (i.e., the light reflection or light transmittance difference between the mark area and the peripheral display substrate area is rather large), making the edge of the mark area clear (e.g., the edge of the groove). Therefore, the clarity of the mark structure is increased, which further improves the recognition success rate of the mark structure.

Figure 2:
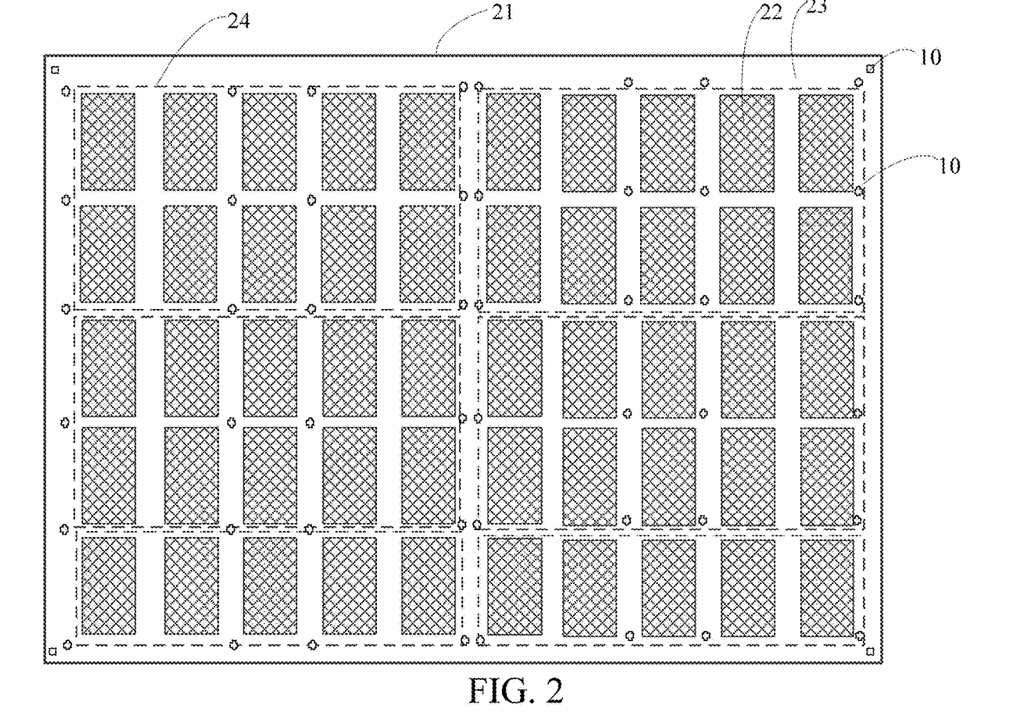
FIG. 2 is a regional schematic diagram of a display substrate motherboard in an embodiment of the disclosure.

FIG. 2 is a regional schematic diagram of a display substrate motherboard in an embodiment of the disclosure. As shown in FIG. 2, in a planar direction parallel to the display substrate motherboard, the display substrate motherboard may include a substrate 21, multiple display substrate areas 22 on the substrate 21 for forming multiple display substrates, and a mark area 23 located on the periphery of the display substrate areas 22, in which multiple mark structures 10 are disposed. Here, 50 display substrate areas 22 and 52 mark structures 10 are shown in FIG. 2, but the number of display substrate areas 22 and mark structures 10 included in the display substrate motherboard is not limited here. Here, a display substrate (single panel) may be formed corresponding to one display substrate area.

For example, the display substrate motherboard may be a motherboard of an array substrate or a motherboard of a color film substrate.

For example, as shown in FIG. 2, in order to facilitate the Mask process, the display substrate motherboard may be divided into multiple Q-panels according to the size of the Mask used in the Mask process. Here, FIG. 2 shows six substrate group areas 24, but the number of substrate group areas 24 and display substrate areas 22 included in the display substrate motherboard is not limited to this. For example, the display substrate motherboard may be divided into four substrate group areas. For example, the first plate alignment mark and the second OL mark (collectively illustrated by cross marks in FIG. 2) are distributed in the gap between adjacent display substrates (single panels), and are set on the left, middle and right of each Q-Panel, with a total count of 48. Of course, these two kinds of marks may be reasonably added or removed according to the distribution of display substrate on substrate (e.g. glass substrate). The average distribution of these two kinds of marks on the substrate (e.g. glass substrate) makes it convenient to carry out exposure correction and control of alignment accuracy test on every position on the substrate (e.g. glass substrate) during exposure alignment and testing in actual process. For example, glass center mark (illustrated by square marks in FIG. 2) may only be disposed at four corners of a substrate (such as a glass substrate), with a total count of four, and their coordinates are completely symmetrical with respect to the center of the substrate (such as a glass substrate), so that the center position of the substrate (such as a glass substrate) may be accurately found in actual testing.

In an exemplary embodiment, a substrate may be a glass substrate or a flexible transparent substrate attached to the glass substrate, which is not limited by the embodiments of the present disclosure.

In an exemplary embodiment, a reflective layer may be made of silver (Ag) material. Of course, embodiments of the present disclosure include but are not limited to this. For example, the reflective layer may be made of other materials with high reflectivity.

In an exemplary embodiment, the material of the planarization layer may include resin. For example, the material of the planarization layer may be epoxy resin. Of course, embodiments of the present disclosure include but are not limited to this. For example, silicon nitride (SiNx) and other materials may be used as the material of the planarization layer.

In addition, the display substrate motherboard may include other necessary components and structures besides the above-mentioned substrate, thin film transistor, mark structure, planarization layer and reflective layer. Those skilled in the art may design and supplement accordingly according to the type of the display substrate motherboard, which will not be described in detail here.

In an exemplary embodiment, the grooves provided at the corresponding positions of the mark structures in the planarization layer and extending in the direction close to the substrate, may be: grooves that penetrate through the planarization layer or grooves that do not penetrate through the planarization layer. When the planarization layer is provided with a groove penetrating through the planarization layer, the mark structure may be disposed in the groove When the groove does not penetrate through the planarization layer, the groove is disposed on the side of the mark structure away from the substrate, and the area where the groove is located in the planarization layer may completely cover the mark structure.

In an exemplary embodiment, an orthographic projection of a groove on a substrate covers an orthographic projection of a mark structure on the substrate. For example, as shown in FIGS. 3A to 3C, the orthographic projection of the mark structure 10 on the substrate 21 may be accommodated within the orthographic projection of the groove 31 on the substrate 21 (i.e., the orthographic projection of the mark structure 10 on the substrate 21 is smaller than the orthographic projection of the groove 31 on the substrate 21, and the edge of the orthographic projection of the mark structure 10 on the substrate 21 does not intersect with the edge of the orthographic projection of the groove 31 on the substrate).

Figure 3A:
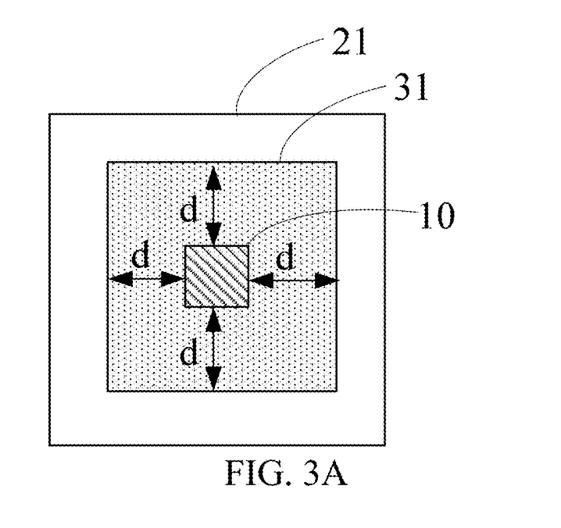
FIG. 3A is a schematic diagram of a mark area in a plane parallel to the display substrate motherboard in the embodiment of the present disclosure.
Figure 3B:
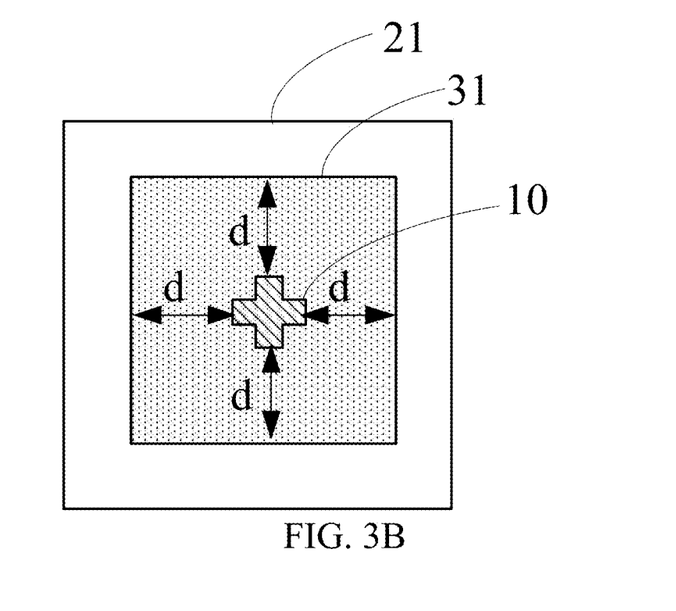
FIG. 3B is another schematic diagram of the mark area in a plane parallel to the display substrate motherboard in the embodiment of the present disclosure.
Figure 3C:
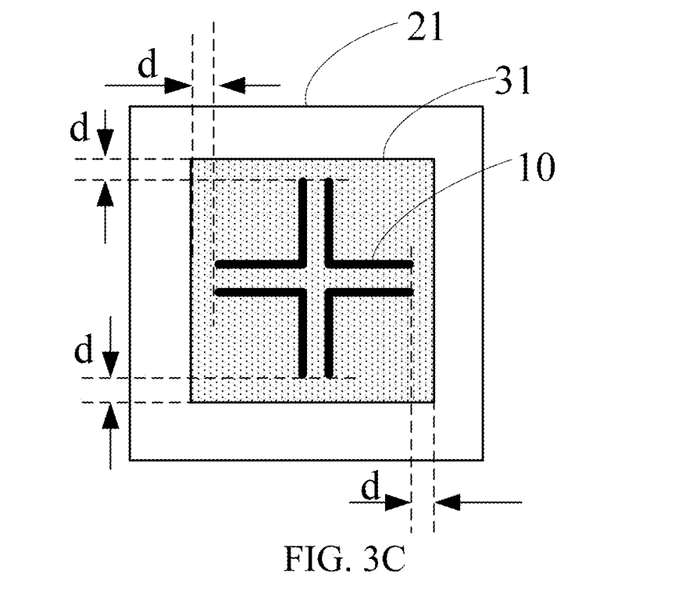
FIG. 3C is another schematic diagram of the mark area in a plane parallel to the display substrate motherboard in the embodiment of the present disclosure.

In an exemplary embodiment, the center of the orthographic projection of the groove on the substrate coincides with the center of the orthographic projection of the mark structure on the substrate (i.e., as shown in FIGS. 3A to 3C, in a plane parallel to the display substrate motherboard, the groove 31 coincides with the center of the mark structure 10, and are centrosymmetric).

In an exemplary embodiment, the cross-sectional shape of the groove is rectangular or square on a plane parallel to the substrate.

In an exemplary embodiment, as shown in FIGS. 3A to 3C, a distance d between an edge of an orthographic projection of a groove on the substrate and an edge of a orthographic projection of the mark structure on the substrate may be 20 μm to 300 μm.

In an exemplary embodiment, the mark structure may be one or more of a rectangular structure and a cross structure. For example, as shown in FIG. 3A, the mark structure 10 may be a square structure. For example, as shown in FIG. 3B, the mark structure 10 may be a solid cross structure. For example, as shown in FIG. 3C, the mark structure 10 may be a hollow cross structure.

In an exemplary embodiment, a mark structure may be disposed in the same layer as at least one of a source/drain metal layer, a gate electrode and an active layer in the thin film transistor. For example, the mark structure may be disposed on the same layer as a source/drain metal layer in the thin film transistor. For example, the mark structure may be disposed in the same layer as a gate electrode in the thin film transistor. Alternatively, the mark structure may be disposed on the same layer as an active layer in the thin film transistor. Of course, embodiments of the present disclosure include but are not limited to this.

In an exemplary embodiment, the mark structure may be a laminated structure, which may include at least two of a first sub-mark disposed in the same layer as the active layer in the thin film transistor, a second sub-mark disposed in the same layer as the gate electrode in the thin film transistor, and a third sub-mark disposed in the same layer as the source/drain metal layer in the thin film transistor, which are sequentially stacked. For example, taking the mark structure is a laminated structure as an example, the laminated structure may include a first sub-mark disposed in the same layer as the active layer in the thin film transistor, a second sub-mark disposed in the same layer as the gate electrode in the thin film transistor, and a third sub-mark disposed in the same layer as the source/drain metal layer in the thin film transistor, which are sequentially stacked. For example, the area of an orthographic projection of a first sub-mark on the substrate is larger than the area of an orthographic projection of a second sub-mark on the substrate, and the area of the orthographic projection of the second sub-mark on the substrate is larger than the area of an orthographic projection of a third sub-mark on the substrate.

In an exemplary embodiment, the mark structure may be made of any metal materials such as molybdenum (Mo), titanium (Ti), aluminum (Al), copper (Cu), or alloy materials made of any one or more of the above metal materials, such as molybdenum niobium alloy (MoNb), etc. The alloy material may be of a single-layer structure or a multi-layer composite structure, such as the composite structure composed of Mo layer, Cu layer and Mo layer.

Next, the display substrate motherboard in the embodiment of the disclosure will be explained by taking a groove penetrating the planarization layer as an example.

Figure 4A:
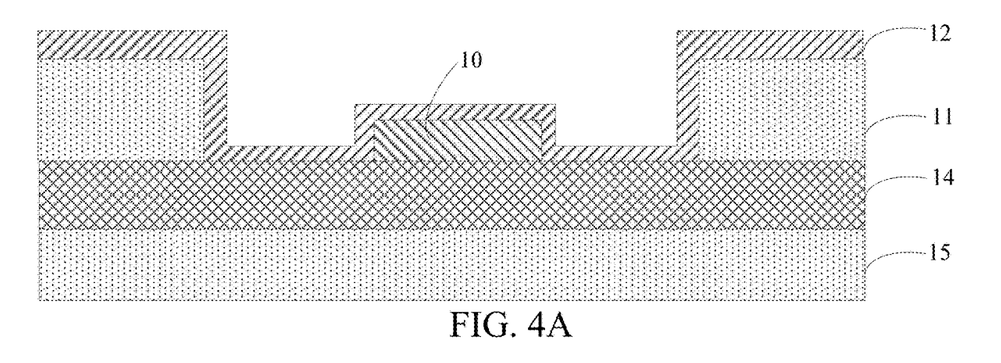
FIG. 4A is a schematic diagram of a mark area in a plane perpendicular to the display substrate motherboard in the embodiment of the present disclosure.

In an exemplary embodiment, FIG. 4A is a schematic diagram of a mark area in a plane perpendicular to the display substrate motherboard in the embodiment of the present disclosure. As shown in FIG. 4A, in a planar direction perpendicular to the display substrate motherboard, the mark area may include a gate insulating layer 15 disposed on the substrate 21, an inter layer dielectric layer 14 disposed on the gate insulator layer 15, a planarization layer 11 with a groove disposed on the inter layer dielectric layer 14, a mark structure 10 disposed in the groove and is disposed in the same layer as the source/drain metal layer in the thin film transistor, and a reflective layer 12 covering the planarization layer 11 and the mark structure 10.

Figure 4B:
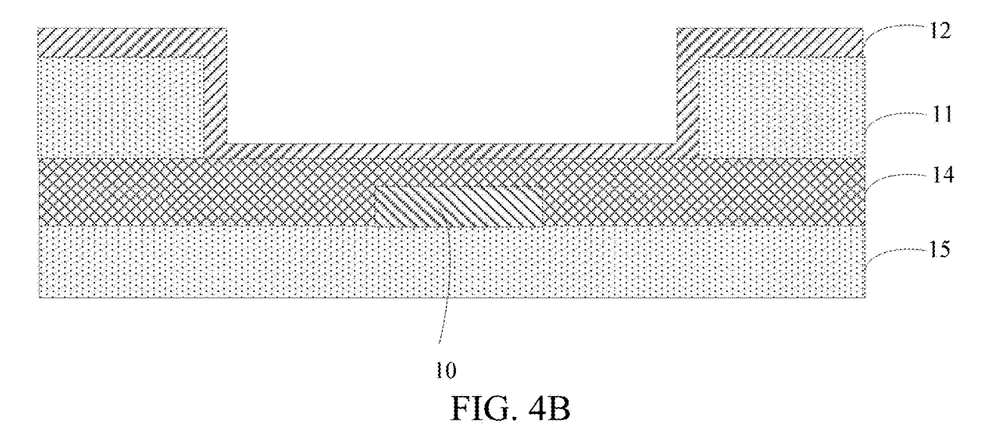
FIG. 4B is another schematic diagram of the mark area in a plane perpendicular to the display substrate motherboard in the embodiment of the present disclosure.

In an exemplary embodiment, FIG. 4B is another schematic diagram of the mark area in a plane perpendicular to the display substrate motherboard in the embodiment of the present disclosure. As shown in FIG. 4B, in a planar direction perpendicular to the display substrate motherboard, the mark area may include a gate insulator layer 15 disposed on the substrate 21, a mark structure 10 disposed on the gate insulator layer 15 in the same layer as the gate electrode in the thin film transistor, an inter layer dielectric layer 14 disposed on the gate insulator layer 15 and the mark structure 10, a planarization layer 11 with a groove disposed on the inter layer dielectric layer 14, and a reflective layer 12 disposed on the planarization layer 11, wherein the groove is disposed at a position corresponding to the mark structure 10.

Figure 4C:
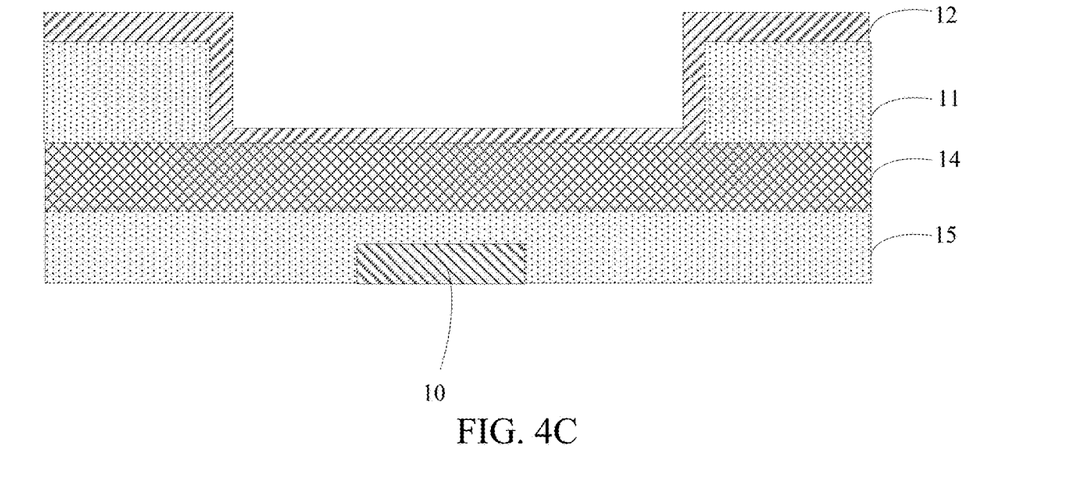
FIG. 4C is another schematic diagram of the mark area in a plane perpendicular to the display substrate motherboard in the embodiment of the present disclosure.

In an exemplary embodiment, FIG. 4C is another schematic diagram of the mark area in a plane perpendicular to the display substrate motherboard in the embodiment of the present disclosure. As shown in FIG. 4C, in a planar direction perpendicular to the display substrate motherboard, the mark area may include a mark structure 10 disposed on the substrate 21 in the same layer as the active layer in the thin film transistor, a gate insulator layer 15 disposed on the gate insulator layer 15 and the mark structure 10, an inter layer dielectric layer 14 disposed on the gate insulator layer 15, a planarization layer 11 with a groove disposed on the inter layer dielectric layer 14, and a reflective layer 12 disposed on the planarization layer 11, wherein the groove is disposed at a position corresponding to the mark structure 10.

Figure 4D:
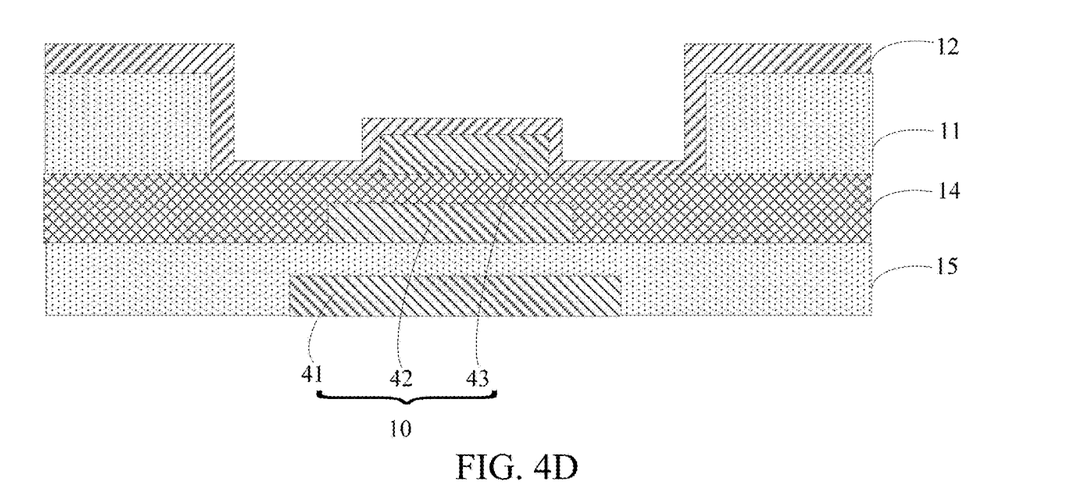
FIG. 4D is another schematic diagram of the mark area in a plane perpendicular to the display substrate motherboard in the embodiment of the present disclosure.

In an exemplary embodiment, the mark structure is a laminated structure including a first sub-mark disposed in the same layer as the active layer in the thin film transistor, a second sub-mark disposed in the same layer as the gate electrode in the thin film transistor, and a third sub-mark disposed in the same layer as the source/drain metal layer in the thin film transistor is taken as an example. FIG. 4D is another schematic diagram of the mark area in a plane perpendicular to the display substrate motherboard in the embodiment of the present disclosure. As shown in FIG. 4D, the mark structure 10 may include a first sub-mark 41. In the planar direction perpendicular to the display substrate motherboard, the mark area may include a first sub-mark 41 disposed on the substrate 21, a gate insulator layer 15 disposed on the gate insulator layer 15 and the first sub-mark 41, a second sub-mark 42 disposed on the gate insulator layer 15, an inter layer dielectric layer 14 disposed on the gate insulator layer 15 and the second sub-mark 42, a planarization layer 11 with a groove disposed on the inter layer dielectric layer 14, a third sub-mark disposed in the groove 43, and a reflective layer 12 covering the planarization layer 11 and the third sub-mark 43. The position of the provided groove corresponds to the position of the third sub-mark 43.

Figure 5A:
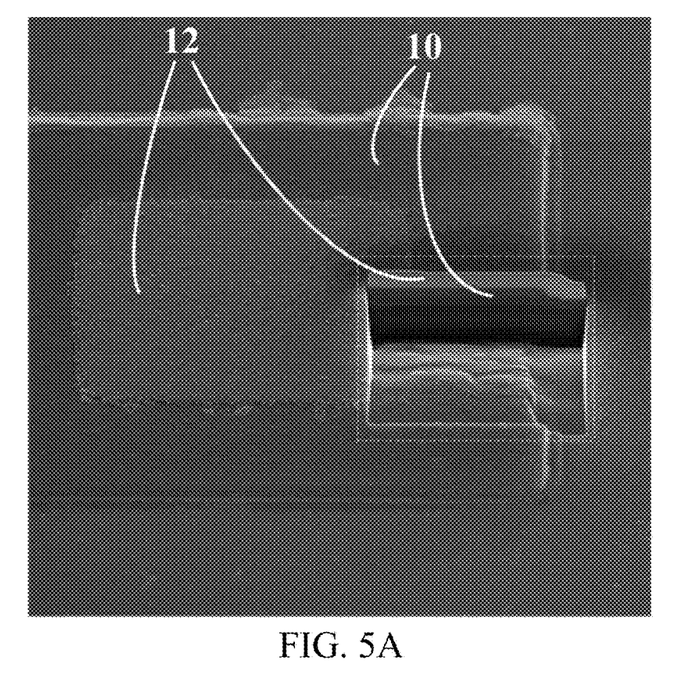
FIG. 5A is an SEM diagram of the mark area shown in FIG. 3A in the embodiment of the present disclosure.
Figure 5B:
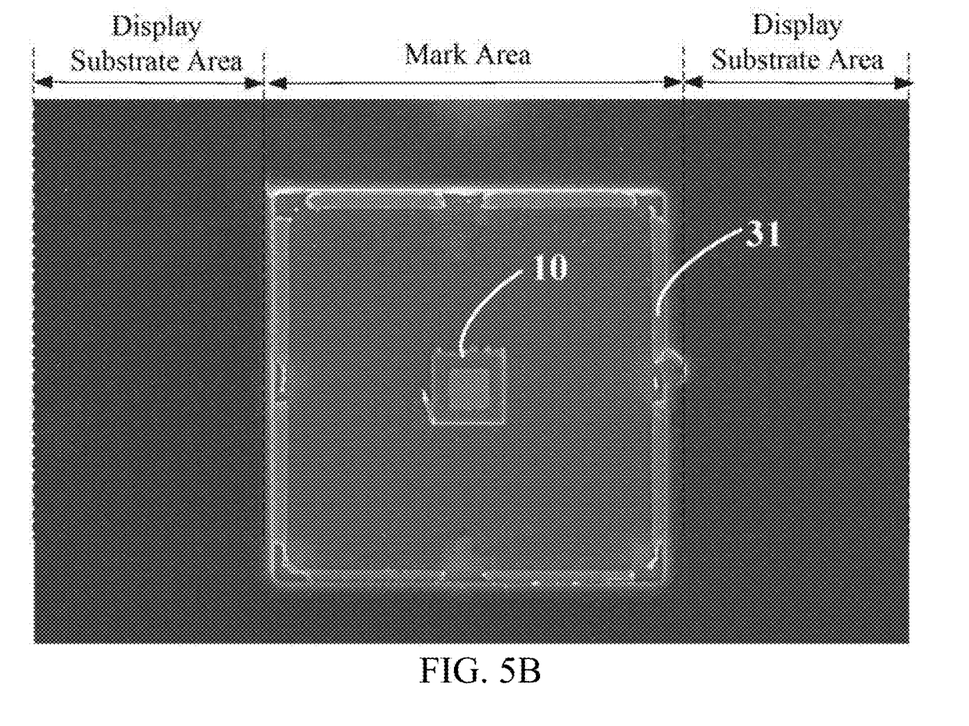
FIG. 5B is another SEM diagram of the mark area shown in FIG. 3A in the embodiment of the present disclosure.

In an exemplary embodiment, for example, the mark structure is disposed in the same layer as the source/drain metal layer in the thin film transistor, and the mark structure is located in a groove which penetrates the planarization layer, a step difference between the mark area and the display substrate area may be about 1.84 µm to 2.76 µm, a thickness of the mark structure may be about 0.46 µm to 0.69 µm, and a thickness of the reflective layer may be about 0.8 µm to 1.2 µm. For example, a thickness of the mark structure may be about 0.58 µm, a thickness of the area corresponding to the mark structure (i.e., the part in the mark area) in the planarization layer may be about 2.3 µm, and a thickness of the area adjacent to the area corresponding to the mark structure (i.e., the part of the display substrate area on the periphery of the mark area) may be about 2.78 µm. Here, since the area corresponding to the mark structure in the planarization layer is removed (i.e., a groove penetrating the planarization layer and exposing the mark structure is provided in the part of the planarization layer located in the mark area), after the reflective layer 12 is entirely formed, the reflective layer (e.g., Ag metal film) 12 will directly contact the mark structure 10, as shown in FIG. 5A. Therefore, a large step difference is formed between the mark structure and the adjacent area, making the light between the mark structure and the lens of the device for identifying the mark is less refracted and less absorbed. Among them, the part shown by the dashed box in FIG. 5A shows the SEM diagram of the cross section of the mark area perpendicular to the substrate. As shown in FIG. 5B, the reflectivity difference between the groove 31 and the mark structure 10 in the mark area and the peripheral display substrate area is rather large (i.e., the light reflection or light transmittance difference between the mark area and the peripheral display substrate area is rather large), making the edge of the mark area clear (e.g., the edge of the groove 31). Therefore, the definition of the mark structure is increased, which further improves the recognition success rate of the mark structure.

Figure 6A:
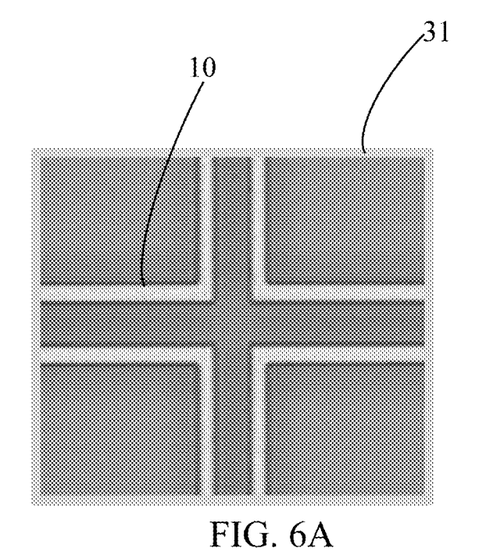
FIG. 6A is a schematic diagram of a recognition result of a mark structure in an embodiment of the disclosure.
Figure 6B:
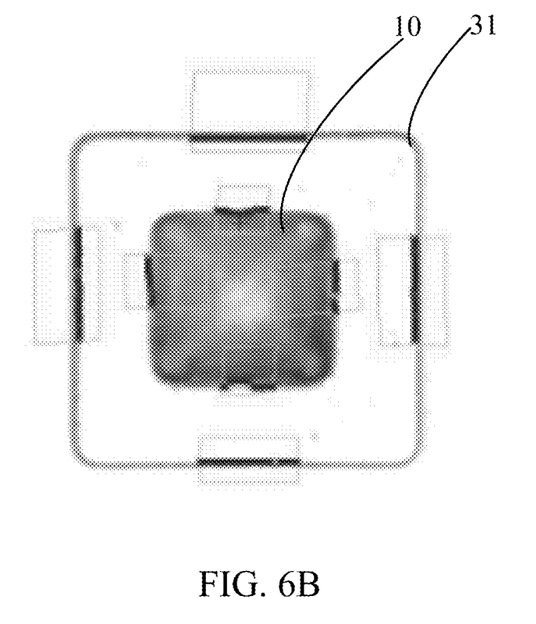
FIG. 6B is a schematic diagram of another recognition result of the mark structure in an embodiment of the disclosure.
Figure 6C:
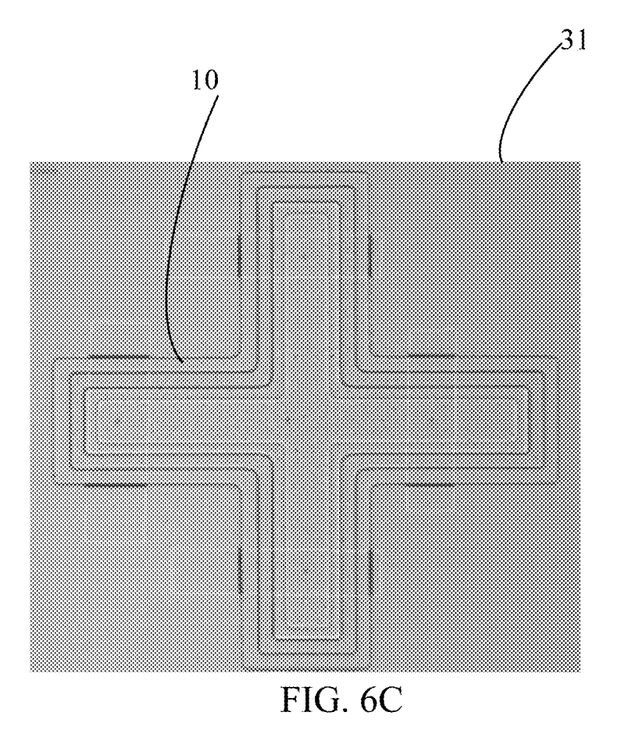
FIG. 6C is a schematic diagram of another recognition result of the mark structure in an embodiment of the disclosure.

For example, as shown in FIG. 6A to FIG. 6C, the mark structure 10 located in the groove 31 may be effectively identified by taking the mark structure is disposed in the same layer as the source/drain metal layer in the thin film transistor as an example.

A structure of a display substrate motherboard according to an embodiment in the present disclosure is described below with an example of a manufacturing process of the display substrate motherboard. The "patterning process" mentioned in the embodiment of the present disclosure includes processes of film layer deposition, photoresist coating, mask exposure, development, etching, and photoresist stripping, etc. Deposition may be implemented by any one or more of sputtering, evaporation, and chemical vapor deposition, coating may be implemented by any one or more of spraying and spin coating, and etching may be implemented by any one or more of dry etching and wet etching. A "thin film" refers to a layer of thin film manufactured by deposition or coating of a certain material on a substrate base. When the "thin film" does not need a patterning process throughout the fabrication process, then the "thin film" may also be referred to as a "layer". When the "thin film" needs a patterning process during the entire manufacturing process, it is called "thin film" before the patterning process and called "layer" after the patterning process. The "layer" subsequent to the patterning process contains at least one "pattern". In the embodiments of the present disclosure, "A and B are disposed on the same layer" means that A and B are formed simultaneously by a same patterning process.

An embodiment of the disclosure further provides a manufacturing method of a display substrate motherboard, the display substrate motherboard includes a substrate, a display substrate area on the substrate, and a mark area on the periphery of the display substrate area. The manufacturing method includes:

S11, forming a thin film transistor in a display substrate area, and forming a mark structure in a mark area;

S12, forming a planarization layer covering a thin film transistor and the mark area; and S13, forming a groove which is disposed at the corresponding position of the mark structure and extends along a direction close to the substrate in the planarization layer.

In an exemplary embodiment, taking the mark structure and the source/drain metal layer of the thin film transistor are in the same layer as an example, the thin film transistor may include an active layer, a gate electrode and a source/drain metal layer. Then, S11 may include: forming an active layer on a substrate; forming a gate insulator layer covering the active layer; forming a gate electrode on the gate insulator layer; forming an inter layer dielectric layer covering the gate insulator layer and the gate electrode; and forming a source/drain metal layer and a mark structure on the inter layer dielectric layer through the same patterning process. Wherein, the active layer, gate electrode and source/drain metal layer are disposed in the display substrate area, and the mark structure is disposed in the mark area.

In an exemplary embodiment, taking the mark structure and the gate electrode of the thin film transistor are in the same layer as an example, the thin film transistor may include an active layer, a gate electrode and a source/drain metal layer. Then, S11 may include: forming an active layer on a substrate; forming a gate insulator layer covering the active layer; forming a gate electrode and a mark structure on the gate insulator layer through the same patterning process; forming an inter layer dielectric layer covering the gate insulator layer, the gate electrode and the mark structure; and forming a source/drain metal layer on the inter layer dielectric layer. Wherein, the active layer, gate electrode and source/drain metal layer are disposed in the display substrate area, and the mark structure is disposed in the mark area.

In an exemplary embodiment, taking the mark structure and the active layer of the thin film transistor are in the same layer as an example, the thin film transistor may include an active layer, a gate electrode and a source/drain metal layer. Then, S11 may include: forming an active layer and a mark structure on the substrate through the same patterning process; forming a gate insulator layer covering the active layer and the mark structure; forming a gate electrode on the gate insulator layer; forming an inter layer dielectric layer covering the gate insulator layer and the gate electrode; and forming a source/drain metal layer on the inter layer dielectric layer. Wherein, the active layer, gate electrode and source/drain metal layer are disposed in the display substrate area, and the mark structure is disposed in the mark area.

In an exemplary embodiment, the mark structure is a laminated structure including a first sub-mark disposed in the same layer as the active layer in the thin film transistor, a second sub-mark disposed in the same layer as the gate electrode in the thin film transistor, and a third sub-mark disposed in the same layer as the source/drain metal layer in the thin film transistor, which are sequentially stacked is taken as an example. The thin film transistor may include an active layer, a gate electrode, and a source/drain metal layer. Then, S11 may include: forming an active layer and a first sub-mark on the substrate through the same patterning process; forming a gate insulator layer covering the active layer and the first sub-mark; forming a gate electrode and a second sub-mark on the gate insulator layer through the same patterning process; forming an inter layer dielectric layer covering the gate insulator layer, the gate electrode and the second sub-mark; and forming a source/drain metal layer and a third sub-mark on the inter layer dielectric layer through the same patterning process. Wherein, the active layer, gate electrode and source/drain metal layer are disposed in the display substrate area, and the first sub-mark, the second sub-mark and the third sub-mark are all disposed in the mark area.

In an exemplary embodiment, taking the mark structure is disposed in the same layer as the source/drain metal layer in the thin film transistor, and the groove penetrates the planarization layer as an example, S13 may include removing the part of the film corresponding to the mark structure in the planarization layer to form a groove penetrating the planarization layer in the planarization layer and the position corresponding to the mark structure, wherein the mark structure is located in the groove.

In an exemplary embodiment, the active layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, embodiment of the present disclosure is applicable to thin film transistors that are manufactured based on oxide technology, silicon technology or organic technology.

In an exemplary embodiment, the gate insulator layer and the inter layer dielectric layer may be made of silicon oxide (SiOx), silicon nitride (SiNx), or silicon oxynitride (SiON), etc., and may have a single-layer structure or a multilayer composite structure.

In an exemplary embodiment, the gate electrode and the source/drain metal layer may be made of metal materials, such as silver (Ag), copper (Cu), aluminum (Al) or molybdenum (Mo), etc., or alloy materials composed of metals, such as aluminum neodymium alloy (AlNd) or molybdenum-niobium alloy (MoNb), etc. The alloy material may be a single-layer structure or a multilayer composite structure, such as a composite structure composed of a Mo layer, a Cu layer, and a Mo layer.

In an exemplary embodiment, the display substrate motherboard further includes: a reflective layer disposed on a side of a planarization layer away from a substrate; the manufacturing method may further include: S14, forming a reflective layer on a planarization layer.

In an exemplary embodiment, taking the same layer as the source/drain metal layer in the thin film transistor, the planarization layer is provided with a groove penetrating the planarization layer and exposing the mark structure as an example, S14 may include forming a reflective layer covering the planarization layer, the groove and the mark structure.

Embodiments of the present disclosure also provide a display substrate, which is formed by a display substrate area obtained by cutting a display substrate motherboard according to one or more of the above embodiments along a mark area.

In an exemplary embodiment, the display substrate may include, but is not limited to, any one of a liquid crystal display (LCD) display substrate, an organic light-emitting diode (OLED) display substrate, a quantum dot light-emitting diode (QLED) display substrate, and an inorganic light-emitting diode display substrate. For example, the display substrate may be an LCD array substrate.

An embodiment of the present disclosure further provides a display device including the display substrate in one or more of the above-mentioned embodiments.

In an exemplary embodiment, a display apparatus may be any product or component with a display function such as a mobile phone, a tablet computer, a television, a display, a laptop computer, a digital photo frame, a navigator, etc. The embodiment of the present disclosure does not limit the type of the display apparatus.

Although the present disclosure discloses the above implementations, the aforementioned content is only the implementations adopted for convenience of understanding the present disclosure, and is not intended to limit the present disclosure. Any person skilled in the art to which the present disclosure belongs may make any modification and change in the form and details of implementation without departing from the spirit and scope disclosed in the present disclosure. However, the scope of protection of the present disclosure shall still be subject to the scope defined in the appended claims.

We claim:

1. A display substrate motherboard comprising: a substrate, a display substrate area on the substrate, and a mark area on a periphery of the display substrate area; wherein the display substrate motherboard also comprises a thin film transistor disposed in the display substrate area, a mark structure disposed in the mark area and a planarization layer disposed on one side of the thin film transistor away from the substrate; and the planarization layer comprises a groove which is disposed at the corresponding position of the mark structure and extends along a direction close to the substrate, and an orthographic projection of the groove on the substrate covers an orthographic projection of the mark structure on the substrate;

wherein the mark structure is a laminated structure, which comprises at least two of a first sub-mark disposed in the same layer as an active layer in the thin film transistor, a second sub-mark disposed in the same layer as a gate electrode in the thin film transistor, and a third sub-mark disposed in the same layer as a source/drain metal layer in the thin film transistor, which are sequentially stacked.

2. The display substrate motherboard according to claim 1, further comprising: a reflective layer disposed on a side of the planarization layer away from the substrate; in a direction away from the substrate, a first area covering the groove in the reflective layer is lower than a second area adjacent to the first area in the reflective layer, and a step difference between the first area and the second area is larger than a preset threshold.

3. The display substrate motherboard according to claim 2, wherein the thickness of the mark structure is 0.46 μm to 0.69 μm, and the thickness of the reflective layer is 0.8 μm to 1.2 μm.

4. The display substrate motherboard according to claim 1, wherein
the groove penetrates through the planarization layer, and the mark structure is located in the groove; or
the groove does not penetrate through the planarization layer, and the area where the groove is located in the planarization layer covers the mark structure.

5. The display substrate motherboard according to claim 1, wherein a center of the orthographic projection of the groove on the substrate coincides with a center of the orthographic projection of the mark structure on the substrate.

6. The display substrate motherboard according to claim 1, wherein a cross-sectional shape of the groove is rectangular or square on a plane parallel to the substrate.

7. The display substrate motherboard according to claim 6, wherein a distance between an edge of the orthographic projection of the groove on the substrate and an edge of the orthographic projection of the mark structure on the substrate is 20 μm to 300 μm.

8. The display substrate motherboard according to claim 1, wherein the mark structure is disposed in the same layer as at least one of a source/drain metal layer, a gate electrode and an active layer in the thin film transistor.

9. The display substrate motherboard according to claim 1, wherein the mark structure comprises one or more of a rectangular structure and a cross structure.

10. The display substrate motherboard according to claim 1, wherein an area of an orthographic projection of the first sub-mark on the substrate is larger than an area of an orthographic projection of the second sub-mark on the substrate, and the area of an orthographic projection of the second sub-mark on the substrate is larger than an area of an orthographic projection of the third sub-mark on the substrate.

11. A display substrate formed by a display substrate area obtained by cutting a display substrate motherboard along a mark area, wherein
the display substrate motherboard comprises a substrate, a display substrate area on the substrate, and a mark area on a periphery of the display substrate area;
the display substrate motherboard also comprises a thin film transistor disposed in the display substrate area, a mark structure disposed in the mark area and a planarization layer disposed on one side of the thin film transistor away from the substrate; and
the planarization layer comprises a groove which is disposed at the corresponding position of the mark structure and extends along a direction close to the substrate, and an orthographic projection of the groove on the substrate covers an orthographic projection of the mark structure on the substrate;
wherein the mark structure is a laminated structure, which comprises at least two of a first sub-mark disposed in the same layer as an active layer in the thin film transistor, a second sub-mark disposed in the same layer as a gate electrode in the thin film transistor, and a third sub-mark disposed in the same layer as a source/drain metal layer in the thin film transistor, which are sequentially stacked.

12. The display substrate according to claim 11, wherein the display substrate motherboard further comprises a reflective layer disposed on a side of the planarization layer away from the substrate; in a direction away from the substrate, a first area covering the groove in the reflective layer is lower than a second area adjacent to the first area in the reflective layer, and a step difference between the first area and the second area is larger than a preset threshold.

13. The display substrate of claim 11, wherein
the groove penetrates through the planarization layer, and the mark structure is located in the groove; or,
the groove does not penetrate through the planarization layer, and the area where the groove is located in the planarization layer covers the mark structure.

14. The display substrate of claim 11, wherein a center of the orthographic projection of the groove on the substrate coincides with a center of the orthographic projection of the mark structure on the substrate.

15. The display substrate of claim 11, wherein a cross-sectional shape of the groove is rectangular or square on a plane parallel to the substrate.

16. The display substrate of claim 11, wherein the mark structure is disposed in the same layer as at least one of a source/drain metal layer, a gate electrode and an active layer in the thin film transistor.

17. A display apparatus comprising the display substrate according to claim 11.

18. A manufacturing method of a display substrate motherboard, wherein the display substrate motherboard comprises a substrate, a display substrate area on the substrate, and a mark area on a periphery of the display substrate area;
the manufacturing method comprises:
forming a thin film transistor in the display substrate area, and forming a mark structure in the mark area;
forming a planarization layer covering the thin film transistor and the mark area; wherein the planarization layer is disposed on one side of the thin film transistor away from the substrate and
forming a groove which is disposed at the corresponding position of the mark structure and extends along a direction close to the substrate in the planarization layer; wherein the planarization layer comprises the groove, and an orthographic projection of the groove on the substrate covers an orthographic projection of the mark structure on the substrate;

wherein the mark structure is a laminated structure, which comprises at least two of a first sub-mark disposed in the same layer as an active layer in the thin film transistor, a second sub-mark disposed in the same layer as a gate electrode in the thin film transistor, and a third sub-mark disposed in the same layer as a source/drain metal layer in the thin film transistor, which are sequentially stacked.

\* \* \* \* \*